United States Patent [19]
Arakawa et al.

[11] 3,979,641
[45] Sept. 7, 1976

[54] VERTICAL DEFLECTION OUTPUT CIRCUITRY FOR TELEVISION RECEIVER

[75] Inventors: Yoshihiro Arakawa; Akio Nakashima; Shunji Iwabuchi; Kenji Ando, all of Yokohama, Japan

[73] Assignee: Hitachi, Ltd., Japan

[22] Filed: May 28, 1974

[21] Appl. No.: 474,025

[30] Foreign Application Priority Data
May 28, 1973 Japan.............................. 48-59496

[52] U.S. Cl............................... 315/397; 315/395; 315/396; 315/403
[51] Int. Cl.²........................................ H01J 29/70
[58] Field of Search ........... 315/395, 397, 403, 389, 315/396, 399

[56] References Cited
UNITED STATES PATENTS
3,727,096  4/1973  Wilcox................................ 315/395
3,786,303  1/1974  Hilburn............................... 315/397
3,794,877  2/1974  Smith et al........................... 315/403

*Primary Examiner*—Malcolm F. Hubler
*Attorney, Agent, or Firm*—Craig & Antonelli

[57] ABSTRACT

A vertical deflection output circuitry for a television receiver wherein two transistors are connected in single ended and push-pull relation, and the output junction point of the two transistors is connected, to a D.C. power source for supplying a higher voltage than that of a power source for the vertical deflection output circuitry, through a switch which is turned off during the vertical scan period and turned on during the vertical retrace period.

8 Claims, 5 Drawing Figures

VERTICAL DEFLECTION OUTPUT CIRCUITRY FOR TELEVISION RECEIVER

The present invention relates to an improvement in a vertical deflection output circuitry using a single-ended push-pull circuit for a television receiver.

A prior art vertical deflection output circuitry using a single-ended push-pull circuit, to enhance the power efficiency, has taken such an arrangement that the voltage applied to the single-ended push-pull circuit having two transistors connected in series is so switched that it is low during the scan period and high during the retrace period. In a construction of such a vertical deflection output circuitry, for example output transistors alternatively driven by an excitation transistor during the scan period and having opposite polarities to each other are connected in series, a series circuit consisting of a vertical deflection coil and a coupling capacitor is coupled in parallel with one of the output transistors which conducts during the latter half of the scan period, a first power source is connected through a diode across the series circuit of these output transistors, and a second power source for supplying a higher voltage than that of the first power source is connected across the series circuit through a switch which is turned off during the scan period and turned on during the retrace period. This prior art vertical deflection output circuitry is operated in such a way that during the retrace period a high voltage is applied through the switch from the second power source while during the scan period a low voltage is applied from the first power source. Thus, this prior art circuitry is improved in power efficiency as compared with another vertical deflection output circuitry which is energized at all times by the high voltage supplied from the second power source.

However, such a merely changing of the power source voltage for energizing the vertical deflection output circuitry fails to prevent the transistor to be conductive during the former half of the scan period from conducting during the retrace period. That is, the output transistor operates as a reverse transistor during the former part of the retrace period and thus its collector current flows in the direction opposite to that of the current when it operates in the normal mode. On the other hand, the collector current flows in the normal direction during the remaining part of the retrace period. Thus, a superfluous power is consumed in that output transistor during the retrace period.

In the prior art circuitry, the withstand voltages required for both the output transistors are high. Further, one of the two output transistors must operate as a reverse transistor. As a result, it is very difficult to fabricate the circuitry into integrated circuits.

Accordingly, an object of the present invention is to provide a vertical deflection output circuitry with a further higher power efficiency, in which a power consumption in the output transistor in a retrace period is reduced as compared with the prior art circuitry of this kind.

Another object of the present invention is to provide a vertical deflection output circuitry which permits the use of the output transistor with low withstand voltage.

Yet another object of the present invention is to provide a vertical deflection output circuitry which does not require the operation of one output transistor as a reverse transistor.

To achieve these objects, the vertical deflection output circuitry according to the invention is arranged such that a diode is connected in series with one of two output transistors which conducts in the former half of the scan period so as not to operate as a reverse transistor, and a second power source for supplying a higher voltage than a voltage of a first power source for supplying the voltage to the vertical deflection output circuitry during the scan period is connected in parallel with the other transistor which conducts in the latter half of the scan period through a switch which is turned off in the scan period and turned on in the retrace period, whereby both the output transistors are turned off in the retrace period.

The above and other objects and features of the present invention will be apparent when reading the following description in conjunction with the accompanying drawings, in which.

The present invention will be described hereinafter with reference to FIGS. 1 to 3.

Figure 1:
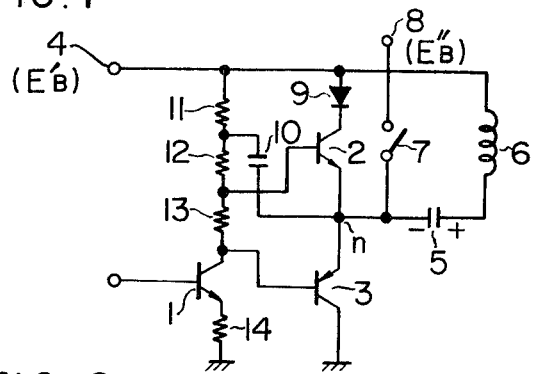
FIG. 1 is a schematic circuit diagram for explaining the principle of an embodiment of the present invention.
Figure 2:
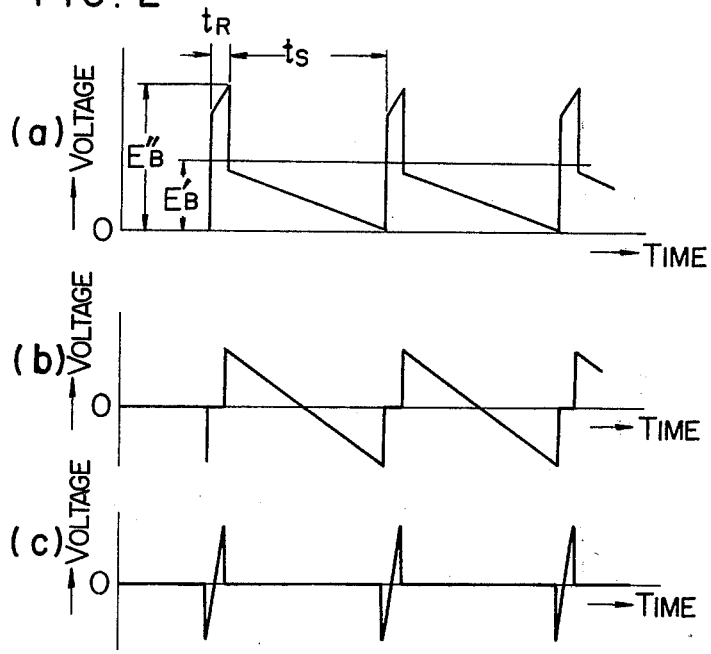
FIG. 2 is the waveforms of current and voltage at the principle points in the circuit of FIG. 1.

With reference to FIG. 1, reference numeral 1 denotes an excitation transistor, numerals 2 and 3 output transistors having opposite poralities to each other, numeral 4 a terminal to which a first source voltage ($E_B'$) is applied, numeral 5 a coupling capacitor, numeral 6 a deflection coil, numeral 7 a switch which is turned off in the scan period and is turned on in the retrace period, numeral 8 a terminal to which a second source voltage ($E_B''$) higher than the first source voltage ($E_B'$) is applied, numeral 9 a diode for preventing the transistor 2 from operating as a reverse transistor, numeral 10 a capacitor, and numerals 11, 12, 13 and 14 resistors. In this circuit diagram, the resistors 11, 12 and 13 are connected in series between the terminal 4 and the collector of the excitation transistor 1, and the resistor 14 is connected to the emitter of the transistor 1 and ground, and such arrangement of those components constitutes the exciting circuit to alternatively drive the transistors 2 and 3 in the scan period. The output transistor 2 is connected such that its base is connected to the junction point between the resistors 12 and 13, its collector is connected through the diode 9 to the terminal 4, and its emitter is connected to the emitter of the transistor 3. The base of the transistor 3 is connected to the collector of the excitation transistor 1 while its collector is grounded. The junction point $n$ between the output transistors 2 and 3 is connected through the capacitor 10 to the junction point between the resistors 11 and 12. It is connected to the terminal 4 through the series circuit of the capacitor 5 and the deflection coil 6, it is also connected to the terminal 8 through the switch 7. The diode 9 may be connected between the junction point $n$ and the emitter of the output transistor 2, although it is provided at the collector side of the output transistor 2 in FIG. 1. In the scan period, the vertical deflection output circuitry is energized by the first power source voltage. In the former half of the scan period, the output transistor 2 is operated by the voltage supplied from the excitation transistor 1, while, in the latter half of the scan period, the output transistor 3 is operated by the same. Such operation produces the current with the waveforms as shown in FIG. 2(b) which flows through the deflection coil 6. The capacitor 5 is charged through the transistor 3 in the latter half of the scan period, and also is discharged through the transistor 2 in the former half of the scan period. As a result, the voltage with the waveforms as shown in FIG. 2(a) appears at the junction point n. The retrace period is the length of time required for change of the current flowing through the deflection coil 6 from its value at the end of a scan to that at the start of the ensuing scan. A prior art circuitry, in order to shorten this retrace period, has been so designed that the voltage supplied to the terminal 4 in the retrace period is obtained from a second power source which supplies a power source voltage higher than that from the first power source by which the vertical deflection output circuitry is driven during the scan period. In such way of merely changing the voltage applied to the terminal 4, the current flowing through the deflection coil 6 in the retrace period, as shown in FIG. 2(c), flows through the output transistor 2. The current flowing through the transistor 2 in the retrace period results in being wasteful of electric power. In order to avoid such power loss, the vertical deflection output circuitry shown in FIG. 1 is constructed such that the diode 9 is connected in series with the transistor 2 and the voltage from the second power source is applied to the junction point n through the switch 7 in the retrace period. For this, the current of the deflection coil 6 does not flow through the transistor 2 but flows through the switch 7. That is, the current of the deflection coil 6 in the retrace period flows through a loop consisting of the terminal 8, switch 7, capacitor 5, deflection coil 6 and terminal 4. Accordingly, the power efficiency of the vertical deflection output circuitry is improved, for the power consumption in the transistor 2 in the retrace period is eliminated.

The withstand voltage of the transistor 2 is not so high as the second power supply voltage ($E_B''$). The withstand voltage of the transistor 2 is in the order of the first power supply voltage ($E_B'$). Additionally, the operation of a reverse transistor which is necessary in the circuitry of the prior art is unnecessary for the transistor 2, thereby resulting in an ease of designing the vertical deflection output circuitry.

It should be noted that the output transistors are not necessarily of opposite polarities to each other, but may be of same polarity type if they can alternatively be conducted by excitation of the excitation transistor to form a single ended push-pull circuit.

Figure 3:
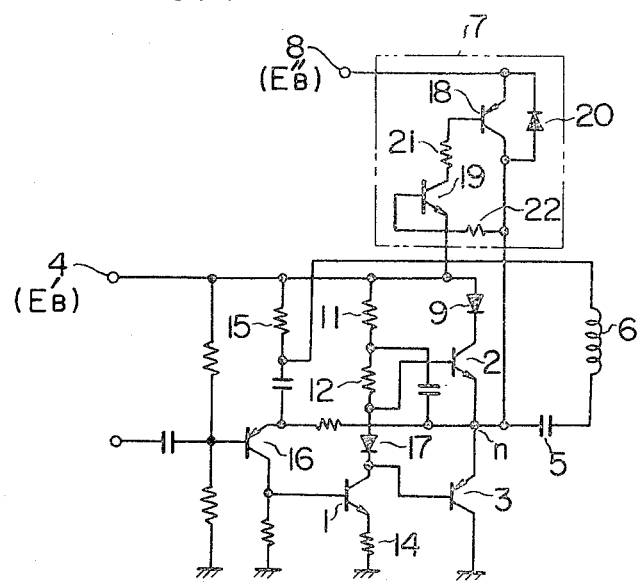
FIG. 3 is a circuit diagram of the vertical deflection output circuitry according to one embodiment of the present invention.

FIG. 3 shows a circuit diagram of a preferred embodiment of the present invention. In the figure, like reference numerals are used therein to denote like parts appearing in FIG. 1. The current flowing through the deflection coil 6 is fed back to a transistor 16 for controlling the excitation transistor 1 through a resistor 15. The resistor 13 in FIG. 1, here, is replaced by a varistor 17 for securing the temperature compensation. Incidentally, the resistor 13 is used to simultaneously conduct the transistors 2 and 3 in order to prevent the current of the deflection coil 6 from discontinuing which would otherwise occur at the transient time of shifting from the former half of the scan period to the latter half thereof. The switch 7 which is turned off in the scan period and is turned on in the retrace period is comprised of transistors 18 and 19, a diode 20, and resistors 21 and 22. The transistor 18 is connected at its emitter to the terminal 8, at its collector to the junction point n, and at its base to the resistor 21 connected with the collector of the transistor 19. The transistor 19 is coupled at its emitter with the terminal 4, at its base with the junction point n by way of the resistor 21. The diode 20 is connected between the terminal 8 and the junction point n. In operation, the potential at the junction point n is raised when the scan period is terminated, since the reverse electromotive force is developed across the deflection coil 6. The increase of the voltage thereat causes the transistor 19 to turn on and then the transistor 18 also to turn on. That is, the switch 7 now is turned on. At this time, the diode 20 clamps the potential at the junction point n to the second source voltage $E_B''$. When the current supplied from the second power supply to the deflection coil 6 reaches the current value being equal to that at the start of the scan, the transistors 16, 1 and 2 are successively turned on, thereby to lower the potential at the junction point n. The reduction of the voltage thereat renders the transistors 19 and 18 off. That is, the switch 7 now is turned off.

As apparent from the foregoing description, the present invention have attained useful and extraordinary improvements over the prior art. In the first instance, the power efficiency is improved due to the fact that the power consumption for the retrace period is reduced, since the transistors 2 and 3 are turned off at this period.

Second, the vertical deflection output circuitry according to the present invention is well adapted in fabrication for integrated circuits. The reason for this is that the withstand voltage required for the transistor 2 may be as low as the first power source voltage ($E_B'$), and the transistor 2 is exempted from the operation as a reverse transistor.

Further, the vertical deflection output circuitry of the present invention may be provided with another switch between the junction point of the switch 7 and the capacitor 5 and the junction point of the transistors 2 and 3, said another switch being turned on in the scan period while turned off in the retrace period. In this case, the withstand voltages of the transistors 2 and 3 can be reduced to the first power supply voltage lower than the second power supply voltage, with an advantageous result that the fabrication of the vertical deflection circuitry into integrated circuits can be very facilitated.

What is claimed is:

1. In a vertical deflection output circuitry including a single-ended push-pull circuit comprising two output transistors, a first series circuit including a deflection coil and a capacitor, a first power source, and an excitation circuit for alternatively making said two transistors conductive in a scan period, the collector-emitter circuits of said two transistors being connected in series with the same direction of current flow thereby to form a second series circuit, the output of said excitation circuit being coupled to the respective bases of said two transistors, said first series circuit being connected between the emitter and the collector of one of said two transistors, and said first power source being connected across said second series circuit, the improvement which a diode is connected in series to the collector-emitter circuit of one of said two transistors which conducts in a first half of the scan period, with the same direction of current flow as that of said collector-emitter circuit, thereby to form a third series circuit, said first series circuit is connected in parallel with one of said third series circuit and the other output transistor which conducts in the latter half of the scan period, and a second power source for supplying a voltage higher than that of said first power source is connected through a switch means between the junction point of said two output transistors and the junction point of said other output transistor and said first power source, said switch means being closed during the retrace period and open during the scan period.

2. A vertical deflection output circuit for television receivers comprising:
   a push-pull output amplifier including a series circuit of two output transistors and a diode disposed between the two terminals of a first operating voltage source, said diode being connected to the collector-emitter circuit of one of said output transistors which is conductive during a first half of the scan period, said diode being connected with the same direction of current flow as the direction of current flow in said collector-emitter circuit of said one output transistor;
   an excitation stage for driving said push-pull output amplifier, said excitation stage including a series circuit of an excitation transistor and at least two resistors connected between the two terminals of the first voltage source;
   a first capacitor connected at one end thereof to the junction point of said at least two resistors and at the other end thereof to the junction point of said two output transistors;
   means for connecting the bases of said two output transistors to said excitation stage;
   a series circuit including a deflection coil and a second capacitor connected at one end thereof to the junction point of said two output transistors and at the other end thereof to a terminal of said first operating voltage source;
   a second voltage source of higher voltage than said first operating voltage source;
   switch means being open during the scan period and closed during the retrace period; and
   applying means for applying said higher voltage from said second voltage source through said switch means to the junction point of said two output transistors.

3. A vertical deflection output circuit as defined in claim 1, wherein the switch means comprises:
   a first transistor having its emitter connected to said first power source, its base connected through a first resistor to said junction point of said two output transistors, and its collector connected through a second resistor to the base of a second transistor;
   said second transistor having its emitter connected to said second power source, and its collector connected to said junction point of said two output transistors;
   a diode connected across said second transistor with its cathode connected to the emitter of said transistor and its anode connected to the collector of said transistor.

4. A vertical deflection output circuit as defined in claim 2, wherein the switch means comprises:
   a first transistor having its emitter connected to said first power source, its base connected through a first resistor to said junction point of said two output transistors, and its collector connected through a second resistor to the base of a second transistor;
   said second transistor having its emitter connected to said second power source, and its collector connected to said junction point of said two output transistors;
   a diode connected across said second transistor with its cathode connected to the emitter of said transistor and its anode connected to the collector of said transistor.

5. A vertical deflection output circuit as defined in claim 2, wherein said at least two resistors include a third resistor in series with said excitation transistor.

6. A vertical deflection output circuit as defined in claim 5, wherein said third resistor is a temperature compensating resistor.

7. A vertical deflection output circuit as defined in claim 6, wherein a small current sampling resistor is connected between said deflection coil and said first power source to provide a current feedback signal for controlling said excitation transistor.

8. A vertical deflection output circuit as defined in claim 7, wherein the switch means comprises:
   a first transistor having its emitter connected to said first power source, its base connected through a first resistor to said junction point of said two output transistors, and its collector connected through a second resistor to the base of a second transistor;
   said second transistor having its emitter connected to said second power source, and its collector connected to said junction point of said two output transistors;
   a diode connected across said second transistor with its cathode connected to the emitter of said transistor and its anode connected to the collector of said transistor.

* * * * *